US009360771B2

(12) United States Patent
Brinkhof et al.

(10) Patent No.: US 9,360,771 B2
(45) Date of Patent: Jun. 7, 2016

(54) ELECTROSTATIC CLAMP, LITHOGRAPHIC APPARATUS, AND DEVICE MANUFACTURING METHOD

(75) Inventors: Eugene Maria Brinkhof, Weert (NL); Jan Bex, Overpelt (BE); Anko Jozef Cornelus Sijben, Veghel (NL); Johannes Wilhelmus Damen, Budel (NL)

(73) Assignee: ASML Netherlands B.V., Veldhoven (NL)

(*) Notice: Subject to any disclaimer, the term of this patent is extended or adjusted under 35 U.S.C. 154(b) by 288 days.

(21) Appl. No.: 14/005,686

(22) PCT Filed: Feb. 7, 2012

(86) PCT No.: PCT/EP2012/052044
§ 371 (c)(1),
(2), (4) Date: Apr. 9, 2014

(87) PCT Pub. No.: WO2012/123188
PCT Pub. Date: Sep. 20, 2012

(65) Prior Publication Data
US 2014/0218711 A1    Aug. 7, 2014

Related U.S. Application Data

(60) Provisional application No. 61/453,719, filed on Mar. 17, 2011, provisional application No. 61/490,682, filed on May 27, 2011.

(51) Int. Cl.
*G03F 7/20*    (2006.01)
*H01L 21/683*  (2006.01)

(52) U.S. Cl.
CPC ........ *G03F 7/70708* (2013.01); *G03F 7/70691* (2013.01); *H01L 21/6831* (2013.01)

(58) Field of Classification Search
CPC . G03F 7/70708; G03F 7/707; G03F 7/70875; G03F 7/70991; H01L 21/6831; H01L 21/6833; H01R 13/02
USPC ..................................... 355/72, 75
See application file for complete search history.

(56) References Cited

U.S. PATENT DOCUMENTS

| 4,139,833 A | 2/1979 | Kirsch |
| 4,502,094 A * | 2/1985 | Lewin ................ H01L 21/6831 118/500 |

(Continued)

FOREIGN PATENT DOCUMENTS

| CN | 101803001 A | 8/2010 |
| EP | 0 947 884 A2 | 10/1999 |

(Continued)

OTHER PUBLICATIONS

International Search Report directed to related International Patent Application No. PCT/EP2012/052044, mailed Jul. 12, 2012; 7 pages.

(Continued)

*Primary Examiner* — Steven H Whitesell Gordon
(74) *Attorney, Agent, or Firm* — Sterne, Kessler, Goldstein & Fox P.L.L.C.

(57) ABSTRACT

An electrostatic clamp for use in holding an object onto a supporting table, the electrostatic clamp comprising: a multi-layer film comprising an electrode defined in an electrically conducting layer which is positioned between electrically insulating layers.

19 Claims, 3 Drawing Sheets

(56) References Cited

U.S. PATENT DOCUMENTS

| | | | |
|---|---|---|---|
| 5,221,403 A | | 6/1993 | Nozawa et al. |
| 5,270,266 A | * | 12/1993 | Hirano ................ H01J 37/3244 118/724 |
| 5,382,311 A | | 1/1995 | Ishikawa et al. |
| 5,646,814 A | * | 7/1997 | Shamouilian ....... H01L 21/6831 361/234 |
| 5,822,171 A | * | 10/1998 | Shamouilian ..... C23C 16/45521 279/128 |
| 5,835,333 A | | 11/1998 | Castro et al. |
| 5,835,334 A | | 11/1998 | McMillin et al. |
| 5,986,873 A | * | 11/1999 | Thomas ................ H02N 13/00 279/128 |
| 8,098,475 B2 | | 1/2012 | Sijben |
| 2002/0044267 A1 | | 4/2002 | Ackerman et al. |
| 2004/0114124 A1 | * | 6/2004 | Hoeks .................... G03F 7/707 355/75 |
| 2004/0178114 A1 | | 9/2004 | Natsuhara et al. |
| 2007/0146679 A1 | * | 6/2007 | Sutedja ............... G03F 7/70708 355/72 |
| 2009/0079525 A1 | * | 3/2009 | Sijben ................ G03F 7/70708 335/72 |
| 2009/0207392 A1 | | 8/2009 | Rijpma et al. |
| 2012/0120545 A1 | | 5/2012 | Fujisawa et al. |
| 2012/0274920 A1 | * | 11/2012 | Bex .................... G03F 7/70708 355/72 |

FOREIGN PATENT DOCUMENTS

| | | |
|---|---|---|
| EP | 1 359 469 A1 | 11/2003 |
| EP | 1 372 009 A1 | 12/2003 |
| EP | 1 411 391 A2 | 4/2004 |
| EP | 1 909 308 A1 | 4/2008 |
| JP | 10-164877 A | 6/1998 |
| JP | 2000-036449 A | 2/2000 |
| JP | 2001-358193 A | 12/2001 |
| JP | 2010-161319 A | 7/2010 |
| WO | WO 96/28842 A1 | 9/1996 |
| WO | WO 2011/001978 A1 | 1/2011 |

OTHER PUBLICATIONS

International Preliminary Report on Patentability and Written Opinion of the International Searching Authority directed to related International Patent Application No. PCT/EP2012/052044, issued Sep. 17, 2013; 8 pages.

* cited by examiner

ELECTROSTATIC CLAMP, LITHOGRAPHIC APPARATUS, AND DEVICE MANUFACTURING METHOD

CROSS-REFERENCE TO RELATED APPLICATIONS

This application claims the benefit of U.S. provisional application 61/453,719, which was filed on 17 Mar. 2011 and which is incorporated herein in its entirety by reference. And also claims the benefit of U.S. provisional application 61/490,682, which was filed on 27 May 2011, and which is incorporated herein in its entirety by reference.

FIELD

The present invention relates to a lithographic apparatus, an electrostatic clamp and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern be formed on an individual layer of the IC. This pattern can be transferred onto a target portion (e.g., e.g., including part of, one, or several dies) on a substrate (e.g., e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings. Along with useful EUV in-band radiation, EUV radiation sources may produce almost equal (and sometimes more) undesirable out-of-band infrared ("IR") and deep ultraviolet ("DUV") radiation.

In a lithographic apparatus, the substrate is held very rigidly on the substrate table so that its position can be accurately known even when the substrate table undergoes high accelerations during its scanning motion. In existing machines, the substrate holder, or chuck, comprises a pimpled surface surrounded by a wall. The substrate rests on the wall and pimples and the space behind it is evacuated so that air pressure above provides a strong clamping force holding the substrate in place. Further details of such a substrate holder can be found in EP-A-0,947,884, incorporated herein by reference.

The above type of substrate holder has proven effective for present day lithographic apparatus. However, as described above to meet the ever-present demand for imaging features of reduced size, it is necessary to reduce the wavelength of the radiation used for the projection beam. Thus, whilst current devices use ultraviolet radiation, e.g., with a wavelength of 248 nm, 193 nm or 157 nm, improved resolution requires the development of lithographic apparatus making use of extreme ultraviolet (EUV) radiation (i.e., with a wavelength of less than about 50 nm), x-rays, electrons or ions. These proposed types of radiation all share the requirement that the beam path, or at least substantial parts of it, must be kept in vacuum. Thus, without any air pressure above the substrate, the conventional vacuum-based substrate holder cannot function.

Similar requirements also need to be met in mask writing, mask cleaning and mask inspection apparatus and so chucks suffer from the same problems as the lithographic projection apparatus.

It has therefore been proposed to use electrostatic forces to hold the substrate onto the substrate table using an electrostatic chuck. To effect this, a potential difference is applied across a dielectric material with electrodes. In one example of such an electrostatic chuck (or clamp) a potential difference is applied between an electrode on the substrate and an electrode in or on the substrate table. When the potential difference is applied, the electrode of the substrate and the electrode of the table become oppositely charged and attract each other with sufficient force to clamp the substrate in place.

U.S. 2002/0044267 discloses a holder that comprises a platen made of the glass ULE™ on which a holder is positioned. The holder may be an electrostatic chuck as disclosed, for example, in U.S. Pat. No. 5,221,403, U.S. Pat. No. 5,835,333 or U.S. Pat. No. 5,835,334.

EP-A1-1,359,469 discloses using a dielectric with certain properties and suggests use of glass or glass ceramics.

WO 2011/001978 and EP-A1-1,909,308 disclose an electrostatic clamp in accordance with the pre-characterising section of claim 1.

SUMMARY

Manufacturing stacks of glass or glass ceramics or ceramics with interposed electrodes is difficult and therefore expensive due to low yield and this also leads to long lead times.

It is desirable, for example, to reduce the complexity of an electrostatic clamp and/or make the manufacture of an electrostatic clamp easier.

According to an embodiment of the present invention, there is provided an electrostatic clamp for use in holding an object onto a supporting table, the electrostatic clamp comprising: a multi-layer film comprising an electrode defined in an electrically conducting layer that is positioned between electrically insulating layers; and a core member onto which the multi-layer film is holdable by application of a potential difference, characterised in that:

the core member comprises a surface with a plurality of projections and the multi-layer film comprises a plurality of through holes such that the multi-layer film is positionable on the surface with the projections extending through the through holes.

According to an embodiment of the present invention, there is provided a device manufacturing method comprising the steps of: imparting a projection beam with a pattern using a mask and projecting the patterned projection beam onto a substrate, wherein the mask is held by a mask table and the substrate is held by a substrate table wherein at least one of the mask and substrate are held to their respective tables by applying a potential difference across an electrically insulating layer of a multi-layer film comprising an electrode defined in an electrically conducting layer positioned on one side of the electrically insulating layer and another electrically insulating layer positioned on the other side of the electrically conducting layer, and by applying a potential difference to hold the multi-layer film onto a core member, characterised in that the core member comprises a surface with a plurality of projections and the multi-layer film comprises a plurality of through holes such that the multi-layer film is positioned on the surface with the projections extending through the through holes.

Various features and advantages of the invention, as well as the structure and operation of various embodiments of the present invention, are described in detail below with reference to the accompanying drawings. The invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

Figure 1:
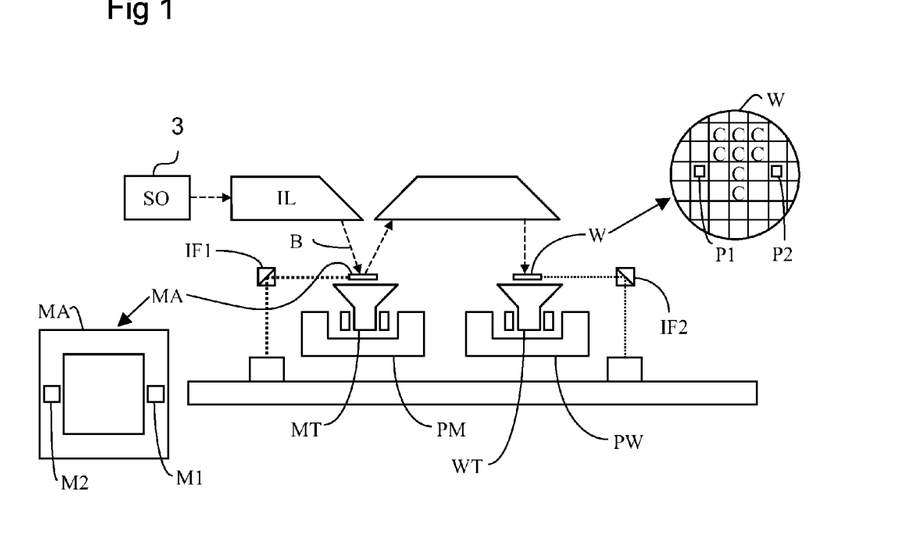
FIG. 1 depicts a lithographic apparatus in accordance with an embodiment of the invention.

FIG. 1 schematically depicts an embodiment of a lithographic apparatus, that can be or include an embodiment of the invention. The apparatus includes an illumination system (illuminator) IL configured to condition a radiation beam B (e.g., EUV radiation); a support structure or patterning device support (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is-reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. It may be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g., employing a reflective mask). Alternatively, the apparatus may be of a transmissive type (e.g., employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO may be part of a radiation system 3 (i.e., radiation generating unit 3). The radiation system 3 and the lithographic apparatus may be separate entities. In such cases, the radiation system 3 is not considered to form part of the lithographic apparatus and the radiation beam is passed from the source SO of radiation system 3 to the illuminator IL with the aid of a beam delivery system including, for example, suitable directing mirrors and/or a beam expander. In other cases, the source may be an integral part of the lithographic apparatus The source SO of the radiation system 3 may be configured in various ways. For example, the source SO may be a laser produced plasma source (LPP source), for example a Tin LPP source (such LPP sources are known per se) or a discharge-produced plasma source (DPP source). The source SO may also be a different type of radiation source.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:
1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.
2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.
3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
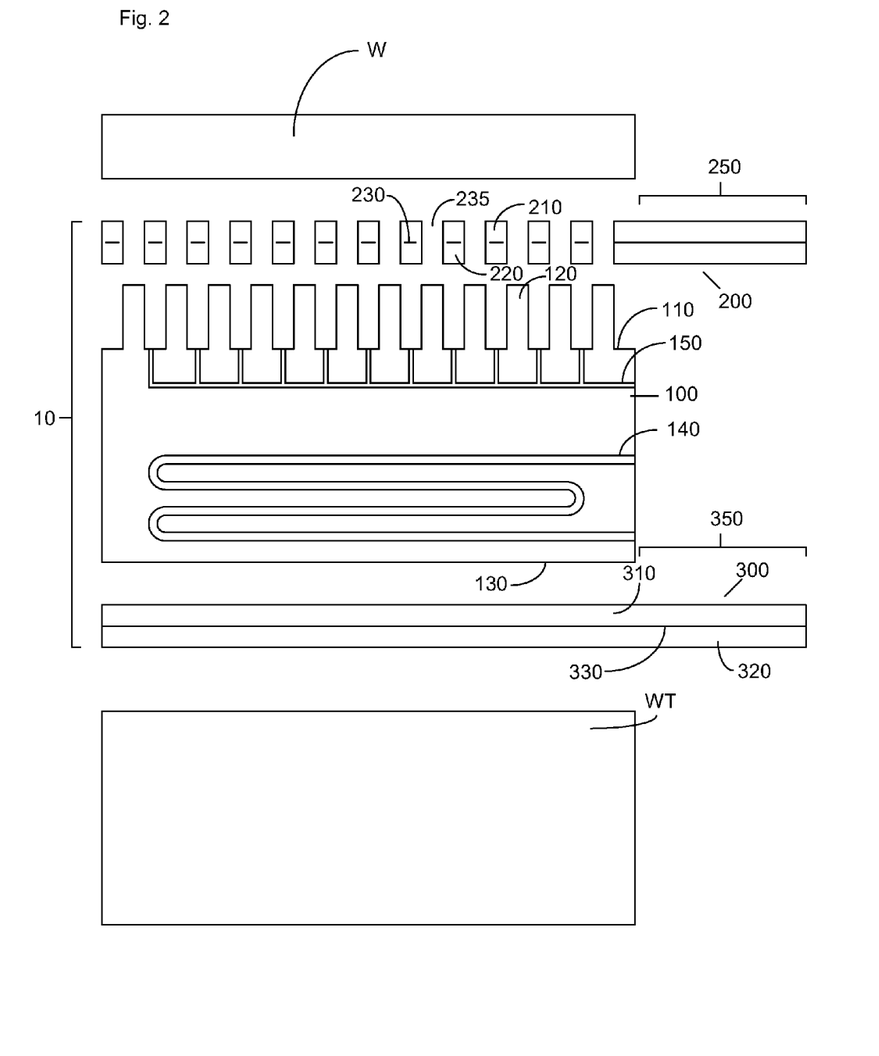
FIG. 2 depicts, in cross-section, an electrostatic clamp in accordance with an embodiment of the invention.

FIG. 2 illustrates, in cross-section, an expanded view of an electrostatic clamp 10 of the present invention. The electrostatic clamp 10 is used for holding the substrate W on the substrate table WT in a lithographic projection apparatus or a substrate handler (e.g., in the vacuum pre-aligner). In other embodiments, the clamp 10 may be used to hold a mask on a mask table in a lithographic projection apparatus or a mask handler.

The electrostatic clamp 10 comprises three main components namely a first film 200, a core 100 and a second film 300. Other designs of clamp are possible. Optionally a metal carrier, e.g., a metal foil or metal plate, can be part of the electrostatic clamp for production and handling reasons. This has the advantage that the electrostatic clamp is more robust.

The first film 200 and second film 300 are multilayer films. The films are produced using film technology such as spin coating, sputtering, spray coating, (screen) printing, chemical vapour deposition (CVD), etc.

Typically the films 200, 300 are flexible meaning that they are not stiff enough to support their own weight. For example, the materials have a relatively low Young's Modulus and the layers are of a relatively low thickness such that the films are deformable under self-weight.

Typically the films 200, 300 can be made in a similar way to flexible films used for electronic circuitry such as flexible PCB or flexible foils such as those available under the tradename HiCoFlex® available from e.g., HIGHTEC MC AG of Lenzburg, Switzerland.

The first and second films 200, 300 comprise an electrically conducting layer 230, 330 sandwiched between electrically insulating layers 210, 220, 310, 320. The electrically conducting layer 230, 330 may be patterned so that the electrically conducting layer defines an electrode or electrodes (or a conducting path) of a desired shape, in plan. More layers may be used, as desired. For example, two or more electrically conducting layers separated by insulating layers and sandwiched between two outer insulating layers may be desirable in certain circumstances.

The core 100 may be made of an electrically conducting material, for example an electrically conductive ceramic. By applying suitable voltages between the electrically conducting layer 230, the core 100 and the electrically conducting layer 330 it is possible that the first film is attracted to the core 100 and to the substrate W and that the second film is attracted to the core 100 and to the substrate table WT. In this way the substrate W can be held to the substrate table WT.

In an embodiment the core 100 may comprise one or more electrodes and/or the substrate table WT can comprise one or more electrodes. However it is preferred that the substrate W and substrate table WT do not need to comprise an electrode in order to generate the desired attraction forces. This may require the defining of more than one electrode in each of the electrically conducting layers 230, 330. A way in which this is achieved is described, for example, in EP-A1-1,359,469, hereby incorporated in its entirety by reference.

The insulating layers 210, 220, 310, 320 of the first and second films 200, 300 may be made of a polymer material or a plastics material. In one embodiment the insulating layers 210, 220, 310, 320 are made of a polyimide, for example poly(4,4'-oxydiphenylene-pyromellitimide) which is available under the trade name Kapton® from DuPont.

In an embodiment the first and second films each have a total thickness of 150 μm or less. In one embodiment the first and second films 200, 300 each have a total thickness of greater than 15 μm. In one embodiment the first and/or second films 200, 300 may be in the form of an ultra thin flexible film (foil) (thickness range 20-50 μm). For example the ultra thin flexible foil may be a HiCoFlex® film such as that available from HIGHTECH MC AG of Lenzburg, Switzerland. Such a film is used in micro electronics. The film is made using spin coating of the insulating layers 210, 220 and splattering sputtering of the electrically conducting layer 230. These processes allow good thickness uniformity to be achieved that is important because the electrostatic force (which is desirably substantially uniform over the area of the substrate W) varies depending upon the variation of the effective gap between the electrically conducting layers 230, 330 and the attracted parts (e.g., substrate W and core 100 for the first film 200 and core 100 and substrate table WT for the second film 300) and this varies with variations in the thickness of insulating layers 210, 220, 310, 320. Using HiCoFlex® film, the thickness uniformity for total thickness is +/−1.5-2 μm.

Each layer of electrically insulating material making up the film may be 7-8 μm thick. The films 200, 300 may comprise two (or more) layers of electrically insulating material (e.g., polyimide) to form the electrically insulating layer 210, 310 with a total thickness of about 15 μm. The electrically conducting layer 230 is then formed by splattering sputtering and might be a few hundred nm thick (e.g., 200 nm thick). The electrically conducting layer 230 may consist of a plurality of layers, for example TiCuTi or NiCr. During sputtering a mask may be used thereby to impart a pattern to the deposited metal. In this way an electrode may be defined in the electrically conducting layer 230. Two or more further electrically insulating layers on top of the electrically conducting layer may be deposited to form the second electrically insulating layer 220, 320 and thereby to encapsulate the electrically conducting layer.

The production of such a thin flexible foil can be done in several ways. For example using a product/process carrier (removable/non-removable, thick/thin, flexible/rigid) or film production (spin coating) directly on the wafertable (or clamp). In these different cases, the end product might be different, for example a separate flexible film, a flexible film on a carrier or a flexible film integrated on a wafertable.

The polymer material or plastics material of the ultra thin flexible foil may be a polyimide. Polyimide withstands the high voltages applied to the electrode (the polyimide needs to be leak-tight (e.g., not be formed without any pinholes) and have good long term physical properties). Also other materials (or combinations of different materials) can be used as insulating layers. For example BCB or Parylene. Also combinations of the previously mentioned materials are possible to use as insulating layer. For example the combination of polyimide and BCB can be used as insulating layer. The advantage of using an ultra thin flexible film is increased simplicity of the clamp, ease of manufacture of the clamp and the possibility of forming an integrated interconnect (see below). That is, formation of a flexible film is easier than bonding glass or glass ceramic or ceramic components together or glass or glass ceramic or ceramic components to electrodes. Additionally manufacture of an ultra thin flexible film is much cheaper.

In an alternative embodiment, the first and/or second films 200, 300 may be made of standard flexible PCB material such as that available from Electronic Apparatus NV, Tessenderlo, Belgium. In an embodiment, such flexible PCB material comprises polyimide, polyester, PTFE, LCP sheets produced by standard processes used by PCB suppliers (e.g., wet etch processing followed by hot laminating (press) processing to glue/laminate several flexible Cu-clads together). Such flexible PCB material is available from DuPont. Typically a flexible PCB can be supplied as a layer of Kapton® (a polyimide, for example poly(4,4'-oxydiphenylene-pyromellitimide)) with an electrically conductive layer on top. The polyimide layer may be 25-150 μm thick and the conductive layer (e.g., copper) may be 9-70 μm thick. Standard techniques can be used to impart a pattern to the copper thereby to define the electrode. Finally a cover layer (for example another polyimide layer) can be glued onto the copper layer to form the upper electrically insulating layer. A layer of Kapton® with an adhesive applied on one side is commercially available for that cover layer with a total thickness of between 25 and 125 μm, typically about 50 μm. This can be glued on top of the patterned conductive layer thereby to form a multilayer film comprising an electrically insulating layer, an adhesive layer, an electrically conducting layer and a electrically insulating layer. In this embodiment, the total thickness of film 200, 300 ends up typically around 100-120 μm, but can range from 60 μm to a few 100 μm.

The polymer or plastics material of the electrically insulating layers in an embodiment has a Young's Modulus equal to or less than 10 GPa, preferably equal to or less than 5 GPa. Polyimide has a Young's Modulus of about 2.5 GPa and this compares to the Youngs modulus of ULE® of 67 GPa.

In an embodiment, as illustrated in FIG. 2, the first film 200 is, in use, positioned on a top surface 110 of the core 100. The second film 300 is positioned between a bottom surface 130 of the core 100 and the substrate table WT.

In an embodiment, the top surface 110 of the core 100 comprises a plurality of projections 120. A plurality of through holes 235 in the first film 200 correspond in position, in plan, to the position of the projections 120. Thereby the first film 200 can be placed onto the top surface 110 of the core 100. The projections 120 then project through the through holes 235. The projections 120 are made to extend from the top surface 110 by a distance greater than the total thickness of the first film 200. In this way, the substrate W rests on the top of the projections 120 with the first film 200 positioned between the bottom surface of the substrate W and the top surface 110 of the core 100.

In an embodiment, a similar arrangement is used on the bottom surface 130 of the core 100. That is projections are present on the bottom surface 130 of the core 100 and corresponding through holes are present in the second film 300. However this is not necessarily the case. As illustrated in FIG. 2, in an embodiment the bottom surface 130 of the core 100 does not comprise projections and the core 100 does not contact the substrate table WT.

As illustrated in FIG. 2, a channel 140 is provided in the core 100. The channel 140 is for the provision of a thermal conditioning liquid therethrough. Such a thermal conditioning liquid can be used to help maintain the core 100 at a constant temperature.

In an embodiment a channel 150 for the provision of gas therethrough can be provided in the core 100. The channel 150 may be for providing a backfill gas inbetween the projections 120 and the substrate W. The first film 200 may have holes in it to allow the backfill gas through to an area between the first film 200 and the substrate W. Such a backfill gas may enhance cleanliness by avoiding the ingress of contamination between the substrate W and the projections 120 and/or can be used to improve thermal distribution on the substrate W.

A further advantage of using a flexible film in the present invention is that an elongate portion 250, 350 may be provided that is integral with the remainder of the film 200, 300. The elongate portion may act as an electrical connection 252 (e.g., an interconnect) between the electrically conducting layer 230, 330 and a voltage source that is distal from the clamp 10. That is, instead using flexible wires somehow connected to an electrode and a voltage source (which wires need to be flexible because the substrate table WT moves in a lithographic apparatus) it is possible to use an integral part of the multilayer film 200, 300 in the place of separate wires.

Figure 3:
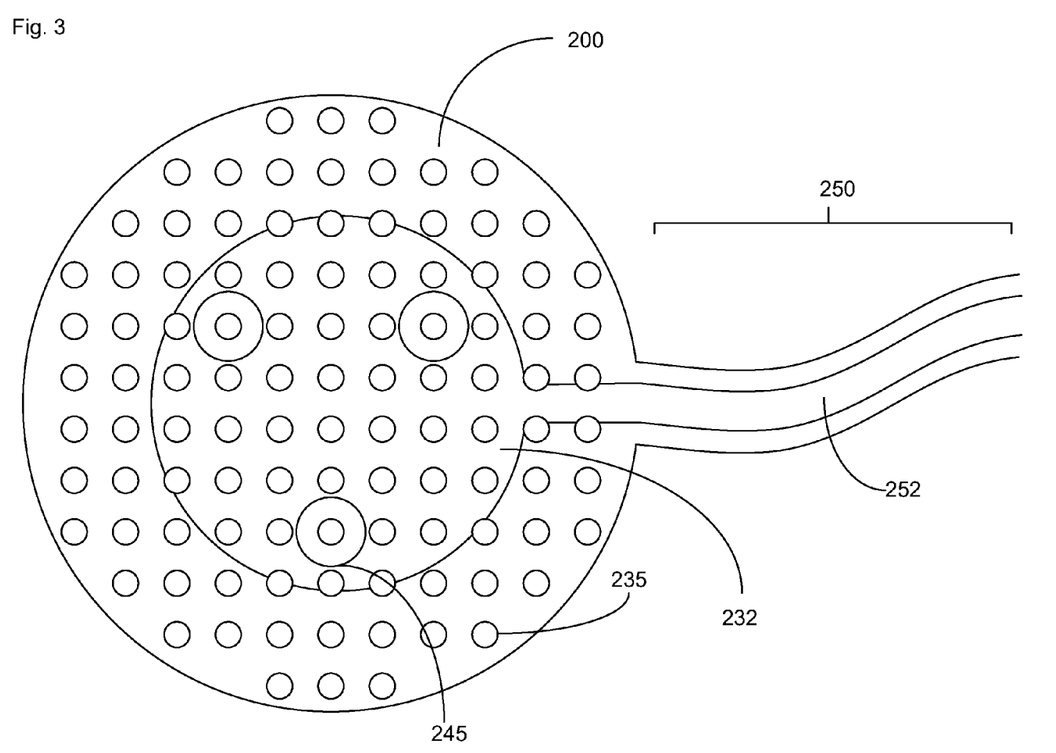
FIG. 3 depicts, in plan, a multilayer film in accordance with an embodiment of the invention.

The elongate portion 250, 350 is more clearly shown in FIG. 3. FIG. 3 is a plan view of the first film 200. The elongate portion 250 can be made any shape and can be used to provide an electrical connection 252 between a voltage source distal from the clamp 10 and the electrode 232 defined in the electrically conducting layer. Because of the flexible nature of the film 200, the elongate portion 250 may bend out of plain.

The electrically conducting layer has defined within it both the electrode 232 and the electrical connection 252 in an integral way. The electrical connection 252 is electrically insulated from the surroundings by the portions of the electrically insulating layers 220, 210 in the elongate portion 250. The portions of the electrically insulating layers 220, 210 in the elongate portion 250 are integral with the corresponding electrically insulating layers 210, 220 which insulate the electrode 232.

As illustrated in FIG. 3, through holes 235 are provided for the projection therethrough of protrusions 120. Additional through holes 245 of a larger size are illustrated. These may be for pins that can also extend through the core 100 and the second film 300 from the substrate table WT. These pins can be used to lift off the substrate W, after exposure.

Although not explicitly illustrated in FIG. 3, the electrode 232 may not extend all the way up to the edge of the through holes 235 such that the edge of the electrode 232 is completely contained within the film 200 and is not exposed to the outside at the edges of the through holes 235. This is illustrated in FIG. 2 by the fact that the electrically conducting layer 230 does not extend all the way up to the edge of the through holes 235.

Although only a single electrode 232 and electrical connection 252 is illustrated in the film 200 of FIG. 3, this need not be the case and any number of electrodes 232 and electrical connections 252 can be present. In an embodiment, in order to avoid the need to provide electrical connection to a substrate, two electrodes 232 are defined in the electrically conducting layer 230 and two corresponding electrical connections 252 are provided.

In an embodiment an electrically conducting path may be defined in the electrically conducting layer 230 and may be connected at opposite ends to electrical connections 252. In this way the electrically conducting path may be used as a heater (by passing a current through it) and/or may be used as a sensor (by detecting, for example, changes in its resistance). The film may then be applied (for example, by adhering) to any surface of a component of a lithographic apparatus and be used as a heater and/or sensor. Example components that may benefit from a local heater and/or local sensor are surfaces of mirrors of the optical system or other optical elements or a chuck.

An advantage of using an elongate portion 250 for electrical connection of the electrode is reduced weight that leads to better dynamics. Additionally the use of a film, particularly of a film made of a polymer material or plastics material is reduced weight over use of glass or glass ceramic or ceramic materials for the same component.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

It is to be understood that in the present application, the term "including" does not exclude other elements or steps. Also, each of the terms "a" and "an" does not exclude a plurality. Any reference sign(s) in the claims shall not be construed as limiting the scope of the claims.

The invention claimed is:

1. An electrostatic clamp for use in holding an object onto a supporting table, the electrostatic clamp comprising:
   a flexible multi-layer film comprising an electrode defined in an electrically conducting layer which is positioned between electrically insulating layers; and
   a core member onto which the flexible multi-layer film is holdable by application of a potential difference, the core member comprises a surface with a plurality of projections, and the flexible multi-layer film comprises a plurality of through holes such that the flexible multi-layer film is removeably positionable on the surface with the projections extending through the through holes.

2. The electrostatic clamp of claim 1, wherein the electrically insulating layers are made of a polymer material or a plastics material.

3. The electrostatic clamp of claim 2, wherein the electrically insulating layers are made of a polyimide, preferably poly(4,4'-oxydiphenylene-pyromellitimide).

4. The electrostatic clamp of claim 1, wherein the electrically insulating layers are formed of a material with a Young's Modulus equal or less than 10 GPa.

5. The electrostatic clamp of claim 1, wherein the flexible multi-layer film has a thickness of 150 μm or less.

6. The electrostatic clamp of claim 1, wherein the flexible multi-layer film comprises an elongate portion comprising an electrical connection for electrically connecting the electrode to a voltage source distal from the clamp, the electrical connection being an integral part of the electrically conducting layer and being electrically insulated by insulators which are integral parts of the electrically insulating layers.

7. The electrostatic clamp of claim 1, wherein the electrically conducting layer is made using sputtering process and/or wherein at least one of the electrically insulating layers is a spin coated layer.

8. The electrostatic clamp of claim 1, wherein the core member is an electrically conductive member and application of a potential difference between the electrode and the core member results in an electrostatic attraction force between the core member and the electrode.

9. The electrostatic clamp of claim 1, wherein the core member has channels defined in it for the passage therethrough of a thermal conditioning liquid.

10. The electrostatic clamp of claim 1, wherein the core member has a plurality of channels defined in it for the passage therethrough of a gas in a direction between the object and the flexible multi-layer film.

11. The electrostatic clamp of claim 1, further comprising a second multi-layer film arranged between the core member and the supporting table, the second multi-layer film comprising a second electrode defined in a second electrically conducting layer between second electrically insulating layers.

12. The electrostatic clamp of claim 1, wherein the electrically insulating layers are formed of a material with a Young's Modulus equal to or less than 5 GPa.

13. The electrostatic clamp of claim 1, wherein the flexible multi-layer film has a thickness of between 25 and 125 µm.

14. The electrostatic clamp of claim 1, wherein the flexible multi-layer film has a thickness of between 20 and 50 µm.

15. A lithographic projection apparatus comprising:
a supporting table configured to hold an object; and
an electrostatic clamp configured to hold the object onto the supporting table, the electrostatic clamp comprising:
a flexible multi-layer film comprising an electrode defined in an electrically conducting layer which is positioned between electrically insulating layers; and
a core member onto which the flexible multi-layer film is holdable by application of a potential difference, the core member comprises a surface with a plurality of projections, and the flexible multi-layer film comprises a plurality of through holes such that the flexible multi-layer film is removeably positionable on the surface with the projections extending through the through holes.

16. The lithographic apparatus of claim 15, wherein the object is a substrate.

17. The lithographic apparatus of claim 15, wherein the object is a mask.

18. The lithographic apparatus of claim 15, wherein the electrostatic clamp further comprises a second multi-layer film arranged between the core member and the supporting table, the second multi-layer film comprising a second electrode defined in a second electrically conducting layer between second electrically insulating layers.

19. A device manufacturing method comprising:
imparting a projection beam with a pattern using a mask; and
projecting the patterned projection beam onto a substrate, wherein the mask is held by a mask table and the substrate is held by a substrate table;
wherein at least one of the mask and substrate are held to their respective tables by applying a potential difference across an electrically insulating layer of a flexible multi-layer film comprising an electrode defined in an electrically conducting layer positioned on one side of the electrically insulating layer and another electrically insulating layer positioned on the other side of the electrically conducting layer, and by applying a potential difference to hold the flexible multi-layer film onto the core member, the core member comprises a surface with a plurality of projections, and the flexible multi-layer film comprises a plurality of through holes such that the flexible multi-layer film is removeably positionable on the surface with the projections extending through the through holes.

* * * * *